United States Patent [19]
Dawson et al.

[11] Patent Number: 5,119,227
[45] Date of Patent: Jun. 2, 1992

[54] OPTICALLY SWITCHABLE DEVICE

[75] Inventors: Philip Dawson, Horsham; Jeffrey J. Harris, Haywards Heath; John W. Orton, Copthorne, all of England

[73] Assignee: U.S. Philips Corp., New York, N.Y.

[21] Appl. No.: 764,670

[22] Filed: Sep. 23, 1991

[30] Foreign Application Priority Data

Sep. 24, 1990 [GB] United Kingdom ............... 9020733
Oct. 19, 1990 [GB] United Kingdom ............... 9022757

[51] Int. Cl.⁵ ...................... G02F 1/015; H01L 27/12
[52] U.S. Cl. ........................... 359/244; 372/11; 357/30; 357/37
[58] Field of Search ............. 359/244; 357/30, 37; 372/11

[56] References Cited

U.S. PATENT DOCUMENTS

| | | | |
|---|---|---|---|
| 4,705,361 | 11/1987 | Frazier et al. | 357/16 |
| 4,795,225 | 1/1989 | Sakai et al. | 359/244 |
| 4,840,446 | 6/1989 | Nakamura et al. | 357/30 |
| 5,047,810 | 9/1991 | Chemla et al. | 357/30 |

FOREIGN PATENT DOCUMENTS

4000023 7/1990 Fed. Rep. of Germany .

OTHER PUBLICATIONS

Kamizato et al; "Excitons in DQW"; Phys. Rev. B., Condens. Matter., vol. 40, #12, pp. 8378-8384; 10/15/89.
Deveaud et al; "An Ultra-Fast Optical Modulator ..."; 8/9/86; pp. 101-103; Springer-Verlag, Germany.
Battersby et al; "The Influence of ... Heart Devices"; IEE Collog., DIG. 108, 90 pp. 12/1-6, 10/27/88.

*Primary Examiner*—Nelson Moskowitz
*Attorney, Agent, or Firm*—William L. Botjer

[57] ABSTRACT

An optically switchable device (1) has a heterostructure (2) defining a first potential well (3) separated by a barrier layer (4) from a second potential well (5) which provides an electron energy level ($e_5$) which is lower in electron energy than the lowest electron energy level ($e_3$) of the first potential well (3). The barrier layer (4) provides an intermediate electron energy level ($e_4$) and is sufficiently thick to inhibit tunnelling of holes from the first (3) to the second (5) potential well. The barrier layer (4) thus confines holes of electron-hole pairs generated in the first potential well (3) by an incident optical beam to the first potential well (3) while facilitating transfer of the electrons from the first potential well (3) to the second potential well (5) via the intermediate electron energy level ($e_4$) provided by the barrier layer (4).

11 Claims, 5 Drawing Sheets

OPTICALLY SWITCHABLE DEVICE

BACKGROUND OF THE INVENTION

This invention relates to an optically switchable device comprising a heterostructure defining a first potential well separated by a barrier layer from a second potential well which provides an electron energy level which is lower in electron energy than the lowest electron energy level of the first potential well.

Such an optically switchable device is described in an article by B. Deveaud et al entitled 'An ultra-fast Optical Modulator: the Double-Well GaAs/GaAlAs Superlattice (DWSL)' published at pages 101 to 103 of the proceedings of the High Speed Electronics International Conference 1986.

As described in the aforementioned article, the second potential well is wider than the first potential well so as to provide an electron energy level lower in electron energy than the lowest electron energy level of the first potential well and the first and second potential wells are closely associated through a thin barrier layer. The relatively narrow first potential well is used as the optically active part of the device where the excitonic absorption can be bleached or saturated very rapidly by an external light source or optical beam. This enables the device to be used as an optical switch which normally absorbs light at the wavelength of the exciton resonance but which allows transmission of such light when the exciton absorption is bleached or saturated, that is when the energy levels of the first potential well are filled by the photo-generated carriers.

In the device described in the aforementioned paper, the relatively wide second potential well is very closely associated with the first potential well and rapidly traps excess carriers in a time typically less than 10 ps (picoseconds) allowing the optical device to return rapidly to the normal steady state in which the exciton resonance is restored when the optical beam which caused the exciton bleaching is switched off or its power density level reduced below that sufficient to sustain bleaching. However, because of the fact that the excess carriers rapidly recombine, an optical beam with a very considerable power density level is required in order to achieve the desired exciton bleaching. Where large parallel arrays of such optical devices are desired, for example for optical computing or image or optical data processing, then the dissipation of the large amount of heat generated by such high power density levels can present problems.

SUMMARY OF THE INVENTION

According to a first aspect of the present invention, there is provided an optically switchable device comprising a heterostructure defining a first potential well separated by a barrier layer from a second potential well which provides an electron energy level which is lower in electron energy than the lowest electron energy level of the first potential well, characterised in that the barrier layer is formed so as to provide an intermediate electron energy level which is lower in electron energy than the lowest electron energy level of the first potential well but higher in electron energy than the lowest electron energy level of the second potential well and the barrier is being sufficiently thick to inhibit tunnelling of holes from the first to the second potential well for confining holes of electron-hole pairs generated in the first potential well by an incident optical beam to the first potential well whilst facilitating transfer of the electrons of the electron-hole pairs from the first potential well to the second potential well via the intermediate electron energy level provided by the barrier layer.

Thus, in an optically switchable device in accordance with the invention, the transfer of electrons from the first potential well to the second potential well is facilitated by the intermediate electron energy level provided by the barrier layer which however continues to provide a potential barrier to the transfer of holes from the first potential well to the second potential well thus enabling the electrons and holes to be well separated so inhibiting recombination.

An optically switchable device in accordance with the invention may thus allow exciton bleaching or saturation to be achieved without the need for the high power density levels required by the device described in the paper by Deveaud et al.

Thus by directing an optical beam of relatively low power density, for example 1 (one) $Wcm^{-2}$ (watt per centimeter$^2$), at the heterostructure sufficient electron-hole pairs can be generated and sufficient electrons transferred via the intermediate electron energy level provided by the barrier layer to result in bleaching of at least one exciton resonance of the heterostructure, usually the electron-heavy hole (e-hh), and the electron-light hole (e-lh) resonance, of the second potential well. Recombination of electrons and holes so as to reinstate the exciton resonance is controlled by the time taken for holes to tunnel through the barrier layer which time is determined at least in part by the thickness of the barrier layer and may, typically, be about 0.5 to 1 $\mu m$ (microsecond).

The present invention provides, in a further aspect, an optical switching apparatus comprising a device in accordance with the first aspect, means for directing at the heterostructure an optical beam with a wavelength for generating electron hole pairs in the first potential well and means for controlling the power density of the optical beam provided by the directing means for switching the optical beam between a first relatively low power density insufficient to cause exciton bleaching and a second relatively high power density for causing sufficient electron-hole pairs to be generated such that electrons transfer from the first potential well to the second potential well to cause bleaching of at least one exciton resonance of the heterostructure to allow transmission through the heterostructure of an optical beam with an energy equivalent to or greater than that of the exciton resonance.

In another aspect, the present invention provides a method of controlling the absorption of a device in accordance with the first aspect, which method comprises directing at the heterostructure an optical beam with a wavelength for generating electron hole pairs in the first potential well and controlling the power density of the optical beam so as to switch the optical beam between a first relatively low power density insufficient to cause exciton bleaching and a second relatively high power density for causing sufficient electron-hole pairs to be generated such that electrons transfer from the first potential well to the second potential well to cause bleaching of at least one exciton resonance of the heterostructure to allow transmission through the heterostructure of an optical beam with an energy equivalent to or greater than that of the exciton resonance.

Thus, using such apparatus or method enables an optical beam to be switched or modulated by the heterostructure by adjusting the optical power density incident on the heterostructure. This adjustable optical power density may be provided by a separate control optical beam which thus serves to switch and modulate an input optical beam or may be provided by the optical beam which is itself being switched so that transmission of the input optical beam is controlled by its own power density.

Such optical switching apparatus has applications in the area of optical computing or image processing and may be particularly advantageous where large parallel arrays of such optical devices are required because the low power densities required to achieve switching result in less heat being generated in the array than with parallel arrays of known devices such as SEEDs and so should reduce the problem of dissipating such heat.

In another example, the heterojunction may form the conduction channel region of a high electron mobility semiconductor device, for example a field effect transistor. In this example, the second potential well will provide the conduction channel of the high mobility semiconductor device and the conduction channel electrons will be provided by the electrons of electron-hole pairs photo-generated by an appropriate optical beam, which electrons transfer from the first potential well via the intermediate electron energy level provided by the barrier layer separating the first and second potential wells. In practice there may be many first and second potential wells so that a series of parallel conduction channels are provided by the second potential wells thereby increasing the current carrying capability of the device.

Where an optically switchable device in accordance with the invention provides a high mobility semiconductor device in which the heterostructure forms the conduction channel region, the possibility of scattering of the conduction charge carriers by dopant impurities is even less than in the case disclosed in for example U.S. Pat. No. 4,163,237 which describes the phenomenon of so-called 'modulation doping'. Thus, in U.S. Pat. No. 4,163,237 conduction occurs in narrow bandgap material potential wells by means of charge carriers provided by virtue of the doping of the wide bandgap barrier layers bounding the narrow bandgap potential well layers. By thus separating the conduction charge carriers from the dopant impurities which provide the conduction charge carriers, the possibility of scattering, and thus a reduction in the mobility, of conduction charge carriers is reduced. However, the presence of the dopant impurities in the barrier layers bounding the potential wells still results, particularly at low temperatures, in some scattering, and thus a reduction in mobility, of the charge carriers in the potential wells.

In contrast to the situation described in U.S. Pat. No. 4,163,237, the conduction charge carriers for the conduction channel region of a high electron mobility device in accordance with the present invention are provided from the first potential well via the intermediate electron energy level provided by the barrier layer separating the first and second potential wells. Accordingly, the source of the conduction charge carriers is well separated from the conduction channel so reducing the possibility of scattering of the conduction electrons and further improving their mobility along the conduction channel(s) provided by the second potential well(s).

In addition because the electrons are provided in the first potential well by photogeneration of electron-hole pairs, there is no necessity for any intentional doping of either the potential wells or the barrier layers and accordingly the possibility of scattering of the conduction electrons being caused by dopant impurities is significantly reduced so leading to significant improvements in electron mobility in the conduction channel provided by the each second potential well.

Again, an optical beam of relatively low power density, for example 1 (one) $Wcm^{-2}$ (watt per square centimeter) may be used to provide electron-hole pairs in the first potential well so that sufficient electrons transfer via the intermediate electron energy level provided by the barrier layer to the second potential well.

The differences in the energy levels of the first and second potential wells may be achieved by forming the first potential well as a relatively narrow potential well and the second potential well as a relatively wide potential well. In such circumstances, the first and second potential wells may be formed of the same material and the electron energy levels controlled by controlling the respective thicknesses of the first and second potential wells. In such a case, the first and second potential wells may comprise layers of gallium arsenide and the barrier layer may comprise a layer of aluminium arsenide. In this case, the first potential well is generally less than 3.5 nm (nanometers), typically 2.5 nm, wide whilst the second potential well is generally greater than 3.5 nm, typically 5 nm, wide. The barrier layer generally has a thickness greater than 2.5 nm, typically 8 nm. Alternatively or additionally, the first and second wells may be formed by layers of different semiconductor material bounded by barrier layers so as to facilitate the provision within the second potential well of an electron energy level lower in electron energy than the lowest electron energy level of the first potential well. This should enable greater flexibility in the difference in energy levels which may be achieved.

Conveniently, the heterostructure defines a plurality of first- and second potential wells. The heterostructure may comprise, in respect of the or each second potential well, a third potential well separated by a further barrier layer from the second potential well, the third potential well providing an electron energy level which is lower in electron energy than the lowest electron energy level of the second potential well and the further barrier layer being formed so as to provide an intermediate electron energy level which is lower in electron energy than the lowest electron energy level of the second potential well but higher in electron energy than the lowest electron energy level of the third potential well for facilitating transfer of the electrons from the second potential well to the third potential well via the intermediate electron energy level provided by the further barrier layer which is sufficiently thick to inhibit tunnelling of holes from the second to the third potential well. This should enable the electrons and holes to be even further separated and may induce, by virtue of this separation, sufficiently high internal electron fields to result in electron field induced energy level shifts enabling the heterostructure to be used as an optical switching device in which electric field induced energy level shifts control the transmission through the heterostructure of an appropriate optical beam.

The provision of a third potential well to which transfer of the electrons is facilitated may, by further inhibiting the recombination of electrons and holes, enable switching of an optical beam by bleaching of at least one exciton resonance to be achieved at even lower power densities than with a heterostructure having only the first and second potential wells. In addition, where the heterostructure forms the conduction channel region of a high electron mobility device, then the incorporation of a third potential well which separates the electrons and holes even further may further reduce the possibility for scattering of the conduction channel electrons.

BRIEF DESCRIPTION OF THE DRAWING

Embodiments of the invention will now be described, by way of example, with reference to the accompanying drawings, in which.

Figure 1:
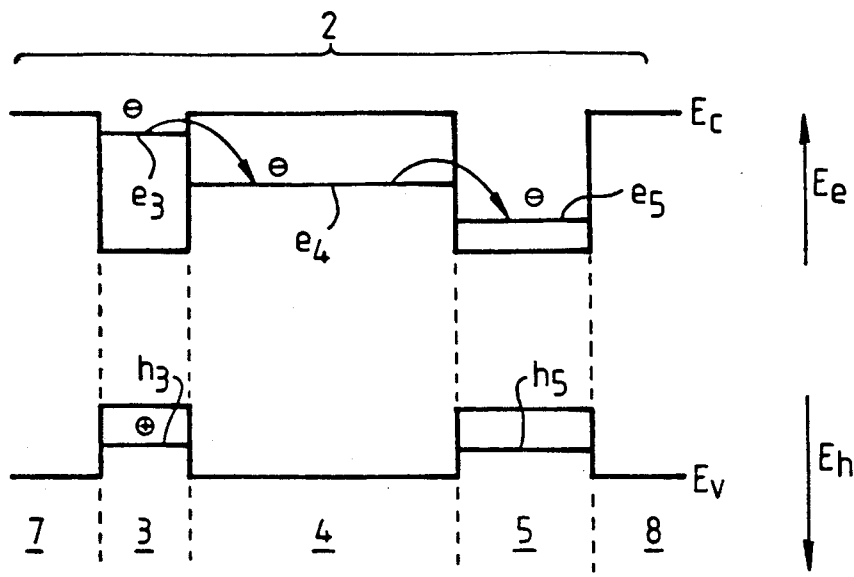
FIG. 1 illustrates schematically an energy band diagram for an optically switchable device in accordance with the invention.

It should be understood that FIGS. 1 to 4 and 6 to 9, in particular, are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

DETAILED DESCRIPTION OF THE PREFERRED EMBODIMENT

Referring now to the drawings, for example. FIGS. 1 to 3, an optically switchable device 1 (FIG. 3) comprises a heterostructure 2 defining a first potential well 3 separated by a barrier layer 4 from a second potential well 5 which provides an electron energy level $e_5$ (FIG. 1) which is lower in electron energy than the lowest electron energy level $e_3$ of the first potential well 3.

In accordance with the invention, the barrier layer 4 is formed so as to provide an intermediate electron energy level $e_4$ which is lower in electron energy $E_c$ than the lowest electron energy level $e_3$ of the first potential well 3 but higher in electron energy $E_c$ than the lowest electron energy level $e_5$ of the second potential well 5 and the barrier layer 4 is sufficiently thick to inhibit tunnelling of holes from the first 3 to the second 5 potential well for confining holes of electron-hole pairs generated in the first potential well 3 by an incident optical beam to the first potential well 3 whilst facilitating transfer of the electrons of the electron-hole pairs from the first potential well 3 to the second potential well 5 via the intermediate electron energy level $e_4$ provided by the barrier layer 4.

Thus, in such an optically switchable device, the transfer of electrons from the first potential well 3 to the second potential well 5 is facilitated by the intermediate electron energy level $e_4$ provided by the barrier layer 4. The barrier layer 4 however inhibits transfer of holes from the first potential well 3 to the second potential well 5. This enables electrons and holes to be well separated and inhibits recombination because this will be dependent on holes tunnelling through the barrier layer 4 to reach the second potential well 5.

Accordingly in the examples to be described below with reference to FIGS. 1 to 7, when an optical beam is incident on the heterostructure 2 with an energy and wavelength suitable for causing photogeneration of electron-hole pairs in the potential wells 3 and 5, the photogenerated electrons will tend to be transferred to the second potential well 5. If the number of electrons transferred to the second potential well 5 is sufficiently high to fill an electron energy level $e_5$ the corresponding exciton resonance will be bleached. Although photogenerated electron-hole pairs remaining in the first or the second potential well 3 or 5 may rapidly recombine, the electrons which have transferred to the second potential well 5 from the first potential well 3 via the intermediate electron energy level $e_4$ provided by the barrier layer 4 are separated from their corresponding photogenerated holes which remain in the first potential well 3. The recombination of these separated electrons and holes will be governed by the time taken for the holes to tunnel through the barrier layer 4 which, as will be discussed below, may be of the order of microseconds.

Because the separated electrons and holes cannot readily recombine, an optical beam of relatively low power density, typically of the order of one $Wcm^{-2}$ (watt per centrimeter$^2$), is sufficient to cause enough electrons to be transferred to the second potential well 5 to fill the electron energy level $e_5$ and so, as will be explained below, bleach at least the electron-heavy hole (e-hh) exciton resonance and the electron-light hole (e-lh) exciton resonance of the second potential well 5, so enabling transmission through the heterostructure 2 of an optical beam having a wavelength equivalent to or greater than in energy than the exciton resonance.

The optically switchable device may thus, as will be described below, be used as an optical switch to control the transmission of an optical beam through the heterostructure 2. The fact that only a relatively low power density is required to achieve bleaching of the exciton resonance to enable transmission of an optical beam makes the optically switchable device particularly suited for use in large area arrays, for example, for optical computing or image processing, where high incident optical power densities can otherwise cause heat dissipation problems.

FIG. 3 illustrates schematically and in cross-section one example of an optically switchable device 1 in accordance with the invention in which the first and second potential wells 3 and 5 are formed of the same material and the second potential well 5 is made wider than the first potential well 3 so as to provide an electron energy level $e_5$ lower in electron energy than the lowest electron energy level $e_3$ of the first potential well 3. The heterostructure 2 defining the optically switchable device 1 shown in FIG. 3 is grown on a substrate 6 using conventional layer-by-layer growth techniques suitable for forming relatively thin layers of the order of 1 to 100 nm, for example molecular beam epitaxy (MBE), metal organic vapour phase epitaxy (MOVPE) or a related method. In this example, the substrate 6 comprises a semi-insulating monocrystalline gallium arsenide (GaAs) substrate although any other suitable III-V semiconductor substrate could be used for example an indium phosphide (InP) or gallium antimonide (GaSb) substrate could be used.

Although not shown in FIG. 3, an epitaxial layer of gallium arsenide is usually grown onto the substrate 6 to improve the morphology of the subsequent heterostructure. Following this buffer layer, a barrier layer 7 of an indirect gap material, in this example aluminium arsenide (AlAs) which is not-intentionally doped, is grown. Typically the barrier layer 7 may be about 10 nm in thickness.

A thin layer of a direct bandgap material, in this example not-intentionally doped gallium arsenide (GaAs), is then grown to form the first potential well 3. The first potential well 3 has a thickness which is typically less than 3.5 nm and greater than 1.9 nm, generally 2.5 nm. The barrier layer 4 is then formed as a layer of an indirect bandgap material again, in this example, not-intentionally doped AlAs with a thickness, in this example, of 8 nm, followed by the second potential well 5 which in this example is formed of not-intentionally doped gallium arsenide and is typically greater than 3.5 nm wide, preferably 5 nm wide. A final barrier layer 8, again of not-intentionally doped AlAs, is then provided to complete the heterostructure 2. The final barrier layer 8 may typically be about 10 nm thick.

FIG. 1 illustrates schematically the energy band diagram for the heterostructure shown in FIG. 3 with, as is conventional, $E_c$ representing the conduction band and $E_v$ the valence band of the heterostructure 2. The arrow labelled $E_e$ indicates the direction of increasing electron energy whilst the arrow labelled $E_h$ indicates the direction of increasing hole energy. It will of course be appreciated that although only single hole energy levels $h_3$, $h_5$ have been shown, each of these levels represents a light hole and a heavy hole level with the heavy hole energy level being of lower hole energy in each case.

As can clearly be seen from FIG. 1, the GaAs first potential well 3 forms a type II structure with the AlAs barrier layers 4 and 7, that is the lowest electron energy level $e_3$ of the GaAs first potential well 3 is higher in electron energy than the X minima of the indirect gap AlAs barrier layer 4. Thus, although the first potential well 3 serves to confine holes, electrons within the first potential well may rapidly transfer to the intermediate energy level $e_4$ provided by the X minima of the AlAs barrier layer 4.

The GaAs second potential well 5, being wider than the first potential well 3, has an electron energy level $e_5$ which is lower in electron energy than the intermediate electron energy level $e_4$ of the barrier layers 4 and 8. Accordingly, the wider second potential well serves to confine both electrons and holes.

Although FIGS. 1 and 3 show the heterostructure 2 as consisting of only one first potential well 3 and one second potential well 5, in practice there may be many first and second potential wells 3 and 5 separated by barrier layers similar to the barrier layer 4.

Figure 4:
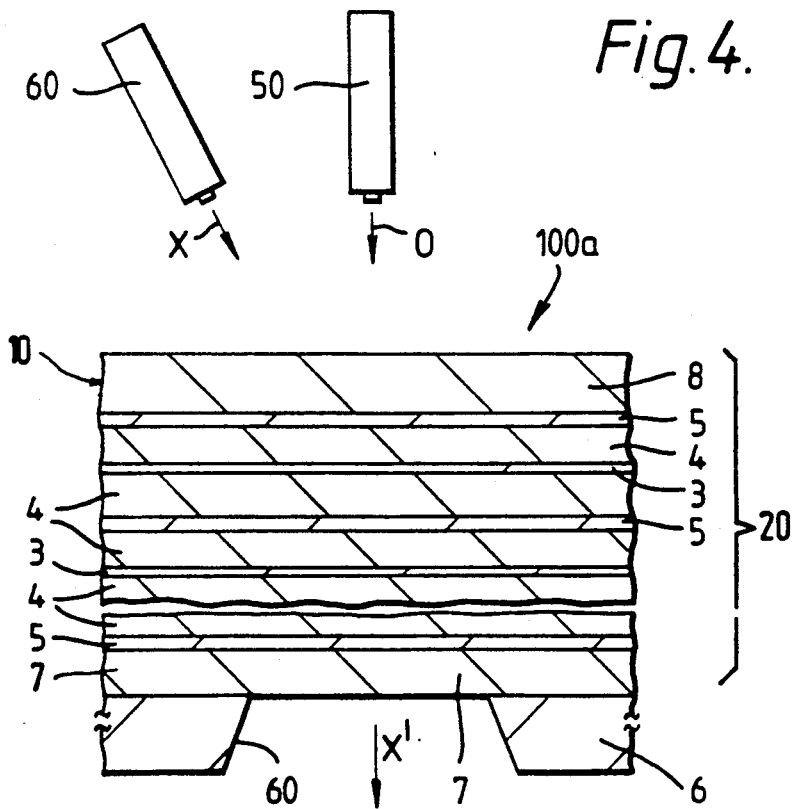
FIG. 4 is similar to FIG. 3 and illustrates schematically a modified version of the optical switching apparatus shown in FIG. 3.

FIG. 4 illustrates schematically and in part cut-away cross-section a modified optically switchable device 10. In the modified device 10 shown in FIG. 4, the heterostructure 20 provides a plurality of first and second potential wells 3 and 5 with each first potential well 3 being positioned between two second potential wells 5 and separated from the second potential wells 5 by barrier layers 4.

In the example shown in FIG. 3 where the first potential well 3 has a second potential well 5 on only one side, the barrier layer 7 may be formed of a different material from the barrier layers 4 so that the barrier layer 7 does not provide an electron energy level lower in electron energy than the first potential well 3' thereby inhibiting transfer of electrons to the barrier layer 7. Alternatively, the heterostructure 2 shown in FIG. 3 may be modified to provide a further second potential well 5, separated by a barrier layer 4 from the first potential well 3, on the other side of the first potential well 3.

As shown in FIGS. 3 and 4, a window 60 is formed through the substrate 6 of the optically switchable device 1 or 10 enable transmission of light through the optically switchable device.

As mentioned above, an optically switchable device 1 or 10 in accordance with the invention facilitates the transfer of electrons of photo-generated electron-hole pairs from the first potential well 3 to the second potential well 5 via the intermediate energy level $e_4$ provided by the barrier layer 4 whilst confining the holes of the photo-generated electron-hole pairs to the first potential well 3.

Thus, when an optical beam with an appropriate wavelength (of the order of 750 nm for the structure described above) equivalent to an energy $h\nu$ equal to or greater than the electron-heavy hole (e-hh) exciton resonance of the first potential well 3 is incident on the heterostructure 2 or 20, electron-hole pairs are generated in the first potential well 3. Of course, because the second potential well 5 is wider than the first potential well 3 and provides a lower electron energy level, the incident optical beam will also cause photogeneration of electron-hole pairs in the second potential well 5. Normally, the photogenerated electrons and holes would recombine relatively rapidly and this will be the case for the photogenerated electrons and holes produced in the second potential well 5.

However, as mentioned above, the barrier layer 4 provides an electron energy level $e_4$ which is lower in electron energy than the lowest electron energy level $e_3$ of the first potential well 3 and so facilitates transfer of photogenerated electrons from the first potential well 3 to the second potential well 5 via the intermediate electron energy level $e_4$ provided by the barrier layer 4.

However, the lowest hole energy level $h_4$ of the barrier layer 4 is sufficiently thick to inhibit tunnelling of holes from the first potential well 3 to the second potential well 5 and accordingly the photogenerated holes produced in the first potential well 3 remain confined in the first potential well 3. The transferred electrons are thus separated from their corresponding photogenerated holes and the time for recombination of these electrons and holes is governed by the time taken for the holes to tunnel from the first potential well 3 to the second potential well 5. This time is determined at least in part by the thickness of the barrier layer 4 and for the material system given above where the barrier layer is 8 nm thickness then the recombination time may be, typically, of the order of 0.5 to a few microseconds.

In the example given above where the barrier layer 4 is formed of AlAs and the potential wells 3 and 5 are formed of GaAs, the barrier layer has a thickness of 8 nm. Generally speaking, depending upon the material system, the barrier layer 4 should be at least 2.5 nm thick and in any case sufficiently thick to inhibit tunnelling of holes from the first to the second potential wells.

Because the electrons transferred from the first potential well 3 to the second potential well 5 cannot readily recombine with holes, a high population of electrons can be built up in the second potential well 5 relatively easily and only a low power density, typically of the order of 1 Wcm$^{-2}$, is required for the incident optical beam to generate sufficient electrons which are transferred to the second potential well 3 to cause bleaching of at least the electron-heavy hole (e-hh) and the electron-light hole (e-lh) exciton resonance of the second potential well 5, so allowing transmission through the heterostructure 2 or 20 of an optical beam with a wavelength equivalent in energy terms to the exciton resonance of the second potential well 5. There may also be some bleaching of the electron-heavy hole exciton resonance of the first potential well 3. However the first potential well 3 may still absorb at wavelengths equivalent or greater in energy terms to the electron-light hole resonance of the first potential well 3.

Figure 2A:
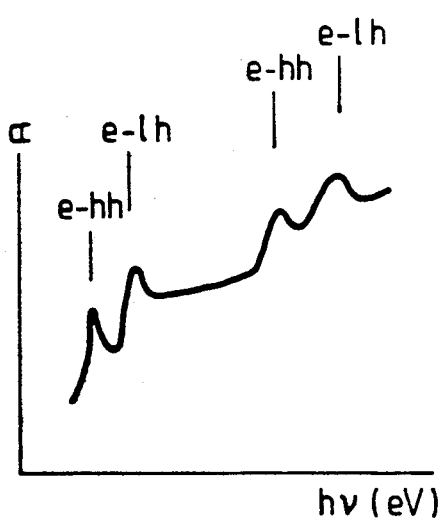
FIGS. 2a and 2b are graphs showing schematically part of the absorption spectrum of an optically switchable device in accordance with the invention for illustrating the effect of an incident optical beam of sufficient power density.
Figure 2B:
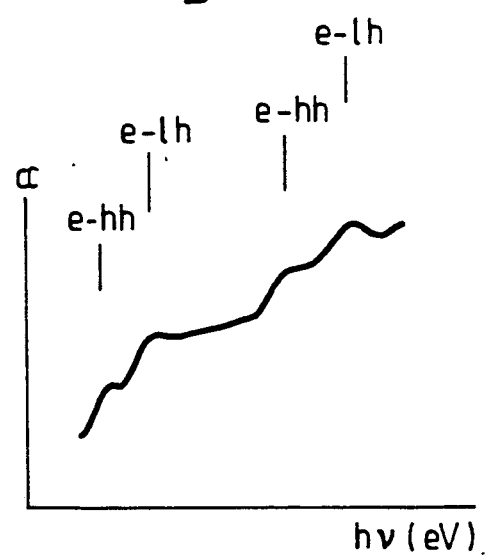
Figure 3:
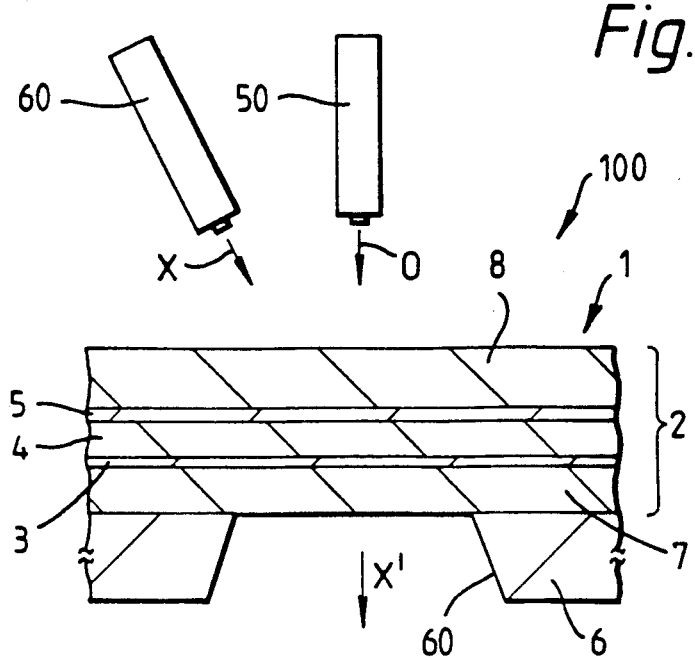
FIG. 3 illustrates schematically a first embodiment of an optical switching apparatus in accordance with the invention, with the optically switchable device shown in cross-section.

FIGS. 2a and 2b are schematic graphs of absorption $\alpha$ against energy (hv) in electron volts eV, not drawn to scale, to illustrate diagrammatically the effect on the absorption spectrum of the heterostructure 2 or 20 shown in FIG. 3 or FIG. 4 of an incident optical beam of appropriate wavelength and power density.

FIG. 2a illustrates the absorption spectrum of the heterostructure 2 or 20 when no optical beam (or an optical beam of insufficient power density) is incident on the heterostructure 2 or 20. As can be seen the spectrum provides four main absorption peaks, peaks A and B being the electron-heavy hole (e-hh) and electron-light hole (e-lh) exciton resonance of the second potential well 5 and peaks C and D being the electron-heavy hole (e-hh) and electron-light hole (e-lh) exciton resonances of the the first potential well 3. As shown, peaks C and D are of course at higher energies and somewhat broader than peaks A and B because the first potential well 3 is narrower than the second potential well 5.

FIG. 2b illustrates the situation when an optical beam of appropriate wavelength and power density if incident on the heterostructure 2 or 20 to cause exciton bleaching as described above. As can be seen from a comparison of FIGS. 2a and 2b peaks A, B and C are much smaller in FIG. 2b than in FIG. 2a so that the absorption of the heterostructure 2 or 20 at the wavelenghts equivalent to the energies of this peaks is much reduced. The effect on the electron-light hole exciton resonance peak D of the first potential well 3 which is at much higher energy than the other peaks A,B and C is rather less.

Figure 5A:
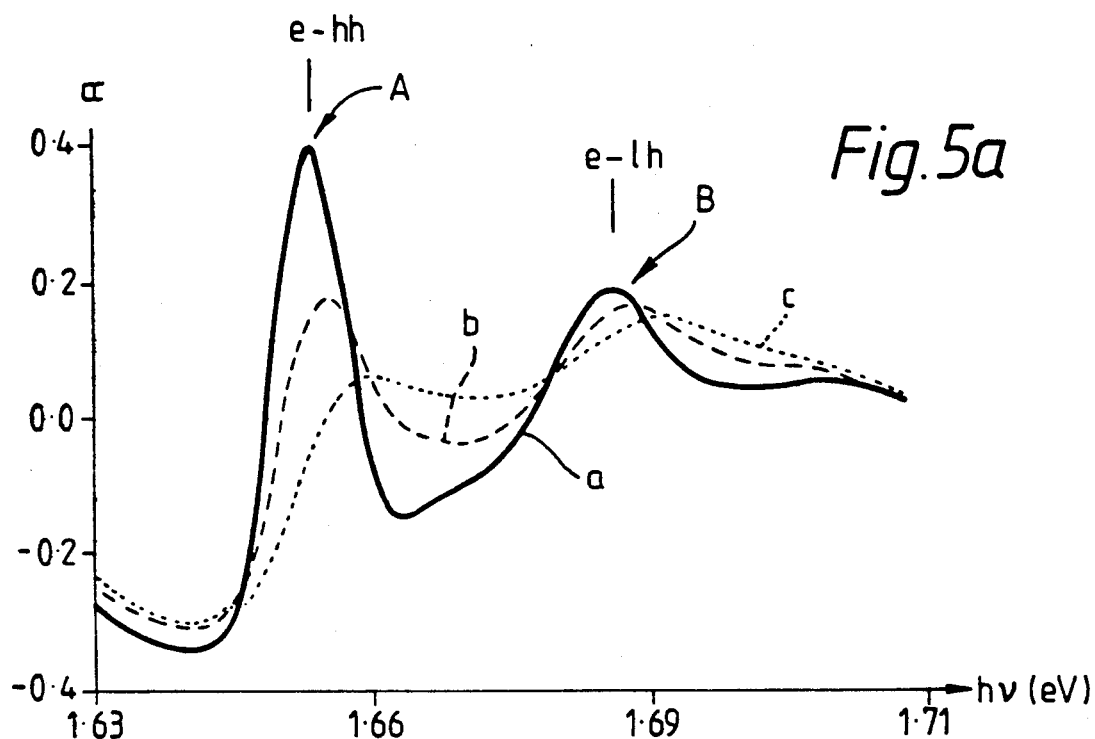
FIGS. 5a and 5b are graphs for illustrating the effect on the absorption spectrum of an optically switchable device in accordance with the invention of different levels of incident optical power density.
Figure 5B:
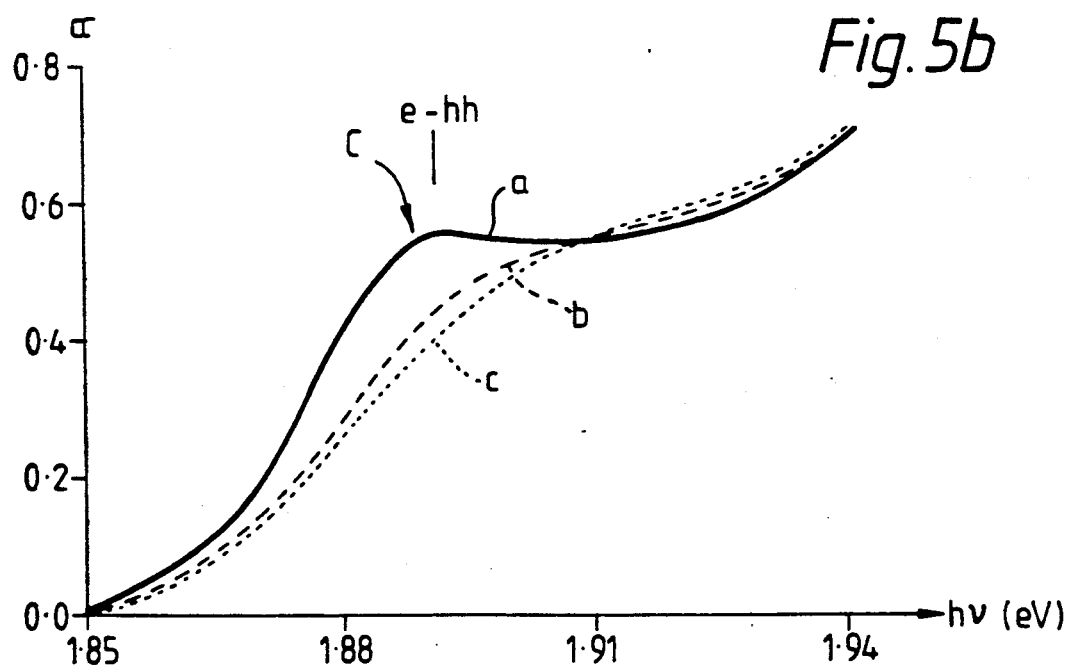

FIGS. 5a and 5b illustrate the results of low temperature experiments carried out on a heterostructure similar to the heterostructure 2 or 20 shown in FIG. 3 or 4 in which the heterostructure 2 or 20 was illuminated from the top surface (i.e. not parallel to the layers of the heterostructure) by a white light source and a pump optical beam with a wavelength of 630 nm and of variable power density was also incident on the heterostructure. The light transmitted by the heterostructure 2 or 20 was monitored using a spectrometer and FIGS. 5a and 5b are graphs of absorption $\alpha$(1-t where t is the transmission coefficient) against energy (hv) in electron volts (eV) for the energy range of the electron-heavy hole and electron light hole exciton peaks A and B of the second potential well 5 and for the electron heavy hole peak C of the first potential well 3, respectively. The exciton resonance peak for the electron-light hole of the first potential well 3 is, as mentioned above, at significantly higher energy (i.e. significantly shorter wavelength) and is not shown. The solid line curve a, dashed line curve b and dotted curve c indicate the absorption spectrum for a pump beam increasing in power density from curve a for which the pump beam is switched off (zero power density) to curve c at which the pump density is 100 Wcm$^{-2}$.

As can be seen clearly from FIGS. 5a and 5b, the resonance peaks A,B and C become smaller with increasing power density of the pump beam and also shift slightly to higher energy. The effect is most significant for the electron heavy hole resonance (e-hh) of the second potential well 5.

An optically switchable device in accordance with the invention has applications as an optical switch, for example for use in image processing or optical computing, and both FIGS. 3 and 4 illustrate optical switching apparatus 100 and 100a, respectively, comprising the respective optically switchable device 1 and 10, an optical beam source 50 of controllable power density and a further optical beam source 60 which may be switched or controlled by the optical beam source 50. The optical beam sources 50 and 60 may be formed by pulsed or continuous wave (cw) lasers of suitable wavelength and output power densities. The lasers may be dye lasers or even, because of the low power densities required, semiconductor lasers.

The optical beam source 50 is selected to provide at least a wavelength or range of wavelengths with an energy sufficient to provide the necessary electrons in the first potential well 3, that is with an energy equal to or greater than that of the e-hh exciton resonance of the first potential well 3. The further optical beam source 60 may provide a wavelength equivalent in energy terms to the e-hh or e-lh resonance of the second potential well 5. The output power density of the optical beam source 50 is controllable.

In use of the appartus shown in FIG. 3 or 4, the optical beam O generated by the optical beam source 50 is absorbed by the heterostructure 2 or 20 where the wavelength or wavelength range of the optical beam is equivalent to an energy equal to or greater than the energy gap between appropriate energy levels of the heterostructure 2 or 20. In particular, the wavelength or wavelength range of the operating optical beam O is selected so as to be equivalent to or greater than in energy terms, the electron-heavy hole exciton resonance of the first potential well 3 which in this example means that the wavelength of the operating optical beam O is typically 750 nm for the heterostructure 2 or 20 described above where the first and second potential wells 3 and 5 are 2.5 nm and 5 nm. respectively.

In operation of the optical switching apparatus shown in FIG. 3 or 4, the output power density of the optical beam O of the optical beam source 50 is switched between a first level which is insufficient to cause exciton bleaching and a second level, of the order of 1 Wcm$^{-2}$, sufficient to cause exciton bleaching, so that, as will be appreciated from the description given above with reference to the graphs shown in FIGS. 2a and 2b and FIGS. 5a and 5b, at the first power density level of the optical beam O significant absorption of the optical beam X of the further optical beam source occurs at the e-hh or e-lh exciton resonance peak A or B of the second potential well. At the second higher power density level, however, sufficient electrons of photogenerated electron-hole pairs created by the optical beam O are transferred to the electron energy level $e_5$ of the second potential well 5 via the intermediate energy level $e_4$ provided by the barrier layer 4 to cause bleaching of at least the e-hh exciton peak A and normally also the e-lh exciton peak B of the second potential wells so that the absorption by the heterostructure 2 or 20 of the optical beam X is significantly decreased. The optical beam O thus controls or modulates the intensity of the portion X' of the optical beam X transmitted by the heterostructure 2 or 20. The optical beam O may be used merely to switch the optical beam D on or off, for example as in an optical logic switch, or may be used to impress optically encoded data onto the optical beam D.

Where the operation beam source 50 provides an optical beam O of an appropriate range of wavelengths, then the optical beam O may be used to control its own transmission through the optical device and the further optical beam source 50 may be emitted.

Such optical switching apparatus may in either case be suitable for use in optical memory devices or image or data processing devices.

Using an optically switchable device in accordance with the invention, the electrons of the photo-generated electron-hole pairs in the first potential well 5 rapidly transfer from the energy level $e_3$ to the lower intermediate energy level $e_4$ provided by the indirect gap barrier layer 4 and thence to the second potential well 5 whilst the photo-generated holes remain confined in the first potential well 3. The photo-generated electrons and holes are thus separated so inhibiting recombination by optical or other means. The fact that recombination of photo-generated electrons and holes in inhibited means that bleaching of the e-hh and possibly e-lh exciton resonance peaks A and B of the second potential well 5 can be achieved at relatively low power density levels, typically 1 Wcm$^{-2}$, so enabling the output power density levels required of the optical beam source 100 to be reduced in comparison to conventional devices such as SEEDs. This facilitates the use of relatively low power semiconductor lasers and may enable the optical beam source 50 to be integrated in the same substrate 6, which would be particularly advantageous where the optically switchable device is to be used as an optical switch in an optical memory or image or data processing device where many such switches may be required in parallel. Also, the fact that the power density level required to cause exciton bleaching is reduced should reduce the amount of heat produced within the optically switchable device which should reduce the problems involved in dissipating such heat.

As mentioned above, recombination of the electrons and holes and thus the return of the exciton absorption peak to its strength before bleaching occurred is dependent upon the time taken for the holes to tunnel through the barrier layer 4 which time is in turn dependent on the barrier thickness. Typically for the barrier thickness and material system described above this time may be of the order of a few microseconds. Depending upon the desired application such a switching time may be acceptable or may be too long. However, the switching time of the optical device may be adjusted for a desired application by alterating the barrier thickness accordingly.

Although in the example described above with reference to FIGS. 3 or 4, the optical beam O is incident on the optical device 1 so as to be transverse to the layers of the heterostructure 2 or 20, it may be possible to direct the optical beam(s) along the layers in which case, there will be no necessity to form the window 60 in the substrate. It may also be possible to form the substrate 6 of a material which is transparent at the operating wavelength(s).

Figure 6:
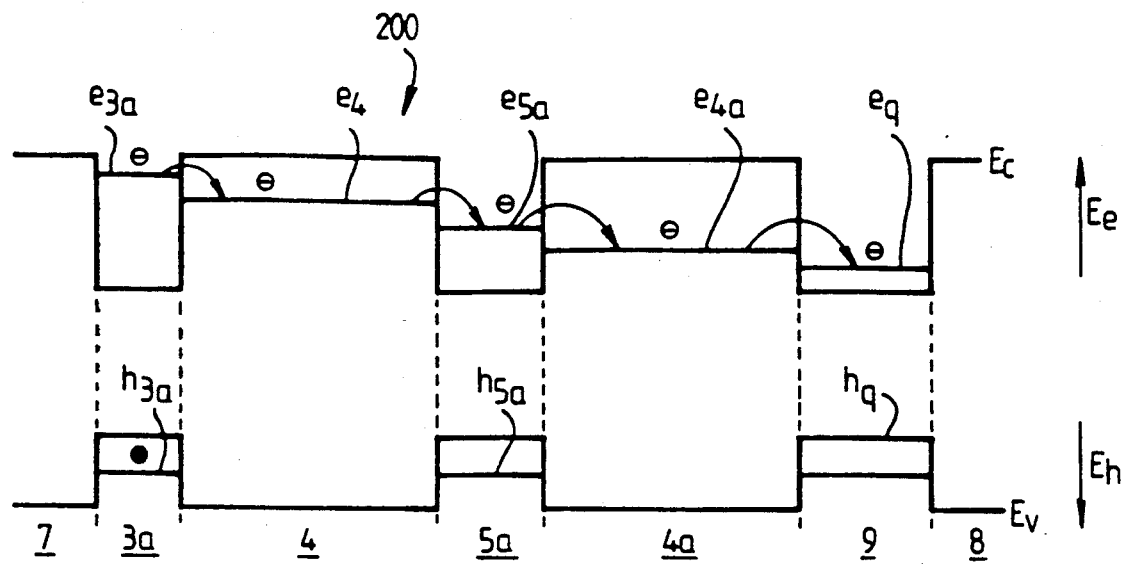
FIG. 6 is a schematic energy band diagram for a further embodiment of a optically switchable device in accordance with the invention.
Figure 7:
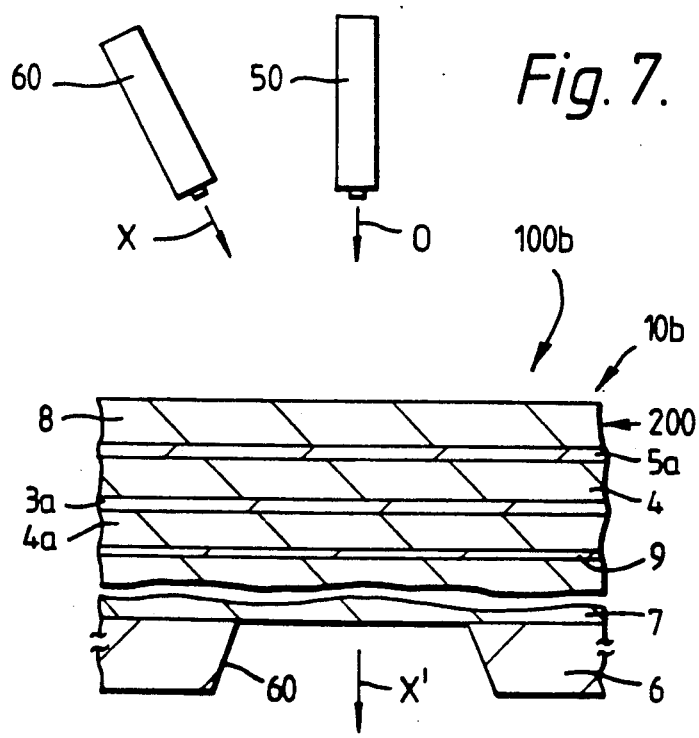
FIG. 7 illustrates schematically a further embodiment of an optical switching apparatus in accordance with the invention using an optically switchable device having the energy band diagram shown in FIG. 6 and with the optically switchable device shown in cross-section.

FIG. 6 shows schematically the energy band diagram for a modified optically switchable device 10b in accordance with the invention which is shown schematically in cross-section, part broken away, in FIG. 7.

As can be seen most clearly from FIG. 6, the heterostructure 200 of the modified optically switchable device 10b provides a third potential well 9 separated from the second potential well 5a by a further barrier layer 4a. This heterostructure 200 is formed, using the conventional growth techniques mentioned above, so that the further barrier layer 4a provides a further intermediate electron energy level $e_{4a}$ lower in electron energy than the lowest electron energy level $e_{5a}$ of the second potential well 5a whilst the third potential well 9 provides an even lower electron energy level $e_9$.

The outer barrier layers 7 and 8 may be formed of the same material as the barrier layers 4 and 4a, respectively, and may again be 10 nm or more thick. As mentioned above with respect to FIG. 3, the barrier layer 7 may alternatively be formed of a different material providing a lowest electron energy level higher than the first potential well 3a so as to inhibit transfer of electrons to the barrier layer 7. Alternatively, the heterostructure 200 may be formed so as to be symmetrical about the centre of the third potential well 9.

Again, the heterostructure 200 may be provided on a gallium arsenide substrate 6 and may be formed so that the first, second and third potential wells 3a, 5a and 9 are of the same material and are of increasing thickness so as to provide the necessary energy levels. As in the example described above, the potential wells 3a, 5a and 9 may be formed of gallium arsenide. In order to achieve the necessary electron energy levels the barrier layers 4 and 4a may be formed of aluminium arsenide and, for example, aluminium gallium arsenide (Al$_x$Ga$_{1-x}$As) with $x>0.45$, for example Al$_{0.8}$Ga$_{0.2}$As, respectively, with such a material system, the barrier layers 4 and 4a may be about 8 nm thick whilst the potential wells 3a, 5a and 9 may be 2.5 nm, 3.5 nm and 5.0 nm respectively.

In such a structure electrons photogenerated by an appropriate optical beam in the first potential well 3a rapidly transfer via the intermediate electron energy level $e_4$ of the barrier layer 4, the electron energy level $e_{5a}$ of the second potential well 5a and the further intermediate electron energy level $e_{4a}$ of the further barrier layer 4a to the third potential well 9 whilst the corresponding holes remain confined to the first potential well 3a. In this case the separation of the electrons and holes is further increased and it should be possible to achieve bleaching of, in this case, the e-hh and possibly the e-lh exciton resonance of the third potential well 9 at even lower power density levels than could be achieved with the optical devices 1 and 10 shown in FIGS. 3 and 4. Of course, the time required for the holes to tunnel to the third potential well 9 will be increased and so the time for the exciton resonance to return to its full strength after reduction of the power density of this optical beam O will be increased.

The modified optical switching apparatus shown in FIG. 7 operates in a manner similar to that described above with reference to FIGS. 3 and 4 but of course the optical beam D should provide a wavelength in the region of the exciton resonance peaks of the third potential well 9 to provide for switching of the optical beam D in dependence on the power density of the optical beam O.

As in the case of FIG. 4, a plurality of potential wells 3a, 5a and 9 may be provided with, for example, the structure being symmetrical about a third potential well 9.

The separation of the electrons and holes in use of an optical device in accordance with the invention will induce an internal electric field within the optical device which, if the separation and number of electrons and holes is sufficient, may induce energy level shifts (the so-called optical quantum confined Stark effect) sufficient to control switching of an optical beam having a wavelength in the vicinity of an appropriate absorption peak of the structure. Such electric fields may be significant in, for example, the case of FIG. 7 where three potential wells 3a, 5a and 9 are provided. It may be possible to enhance this effect, depending upon the material system, by providing a series of four or more potential wells and barrier layers with cascading electron energy levels although of course the switching time in such a case would be rather long.

Figure 8:
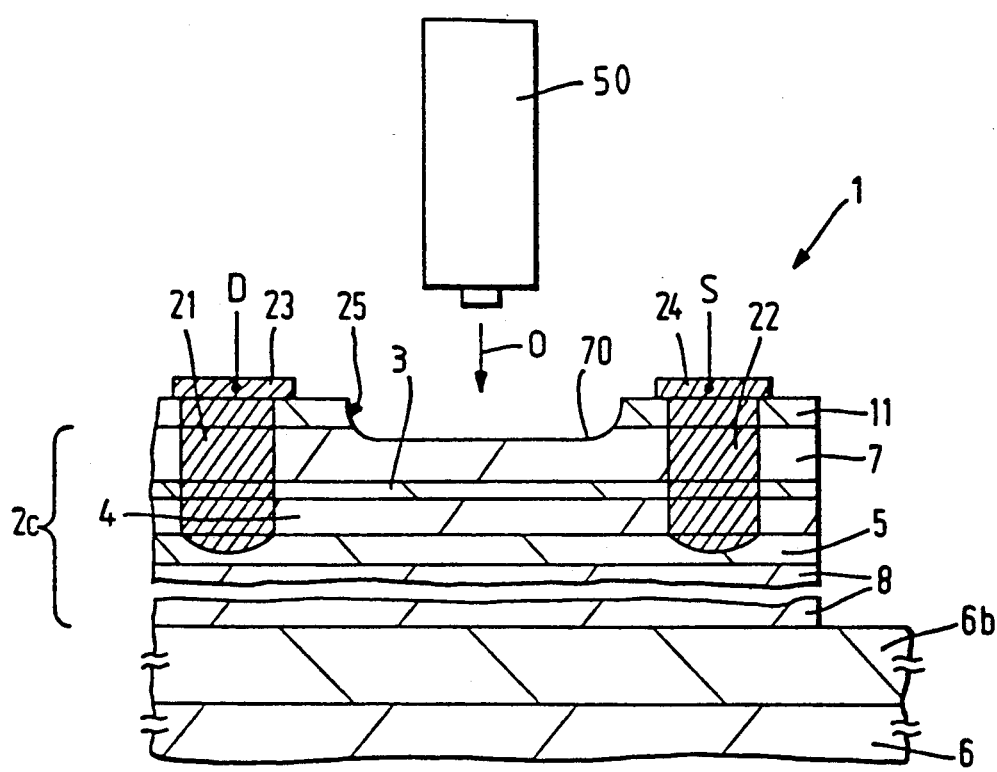
FIG. 8 illustrates schematically and in part broken-away cross-section a first embodiment of an optically switchable device comprising a high mobility semiconductor device in accordance with the invention in combination with an optical beam source.

FIG. 8 illustrates another example of an optically switchable semiconductor device 10c in accordance with the invention. In this example the optically switchable semiconductor device 10c comprises a high electron mobility semiconductor device, as shown a high electron mobility transistor (HEMT) and the heterostructure 2c forms the conduction channel region of the HEMT 10c.

The heterostructure 2c forming the conduction channel region of the HEMT 10c has the same energy band diagram as the heterostructure 2 illustrated in FIG. 1 and thus is the same as the heterostructure 2 shown in FIG. 3 except, as will be appreciated from a comparison of FIGS. 3 and 8, the heterostructure 2c is inverted with respect to the substrate 6 so that the barrier layer 8 is provided on the substrate 6 followed by the second potential well 5.

In addition, FIG. 8 shows an epitaxial buffer layer 6b on the substrate 6. The epitaxial buffer layer 6b may, as discussed above, merely be an epitaxial intrinsic gallium arsenide layer. However, although not specifically shown, an undoped superlattice buffer layer may be provided on and in addition to the epitaxially grown gallium arsenide layer. The superlattice buffer layer may consist of, for example, alternate layers of gallium arsenide and aluminium arsenide layers selected to have a composition equivalent to an $Al_xGa_{1-x}As$ alloy where $x=0.25$. Where such a buffer layer is provided then the buffer layer and epitaxial layer 6b may each be about 0.5 μm (micrometers) thick. In all other respects, that is in respect of types of materials and layer thicknesses, the heterostructure 2c shown in FIG. 8 may be identical to the heterostructure 2 shown in FIGS. 1 and 3.

A capping layer 11 of gallium arsenide having a thickness of from about 10 to about 30 nm and doped with an impurity of the one conductivity type, that is n conductivity in this example, to a dopant concentration of about $1.5 \times 10^{18}$ atoms $cm^{-3}$ is provided on the barrier layer 7.

Input and output or source and drain regions 21 and 22 are formed by local diffusion of dopants of the one conductivity type, in this example n conductivity type, into the ends of the conduction channel region 2 from the surface so as to extend just into the second potential well 5. The dopants may be introduced from a suitably doped metal alloy, for example an alloy of gold with an appropriate dopant, provided on the surface. So that subsequent source and drain electrodes 23 and 24 provide good ohmic contact, further gold may be deposited onto that used to dope the source and drain regions 21 and 22. A suitable alloy such as a eutectic AuGe alloy containing 5 per cent by weight of nickel may be used to form the source and drain electrodes 23 and 24.

A recess 25 formed by suitable masking and selective etching is provided between the source and drain electrodes 23 and 24 to expose an area 70 of the final barrier layer 7. An optical beam source 50 provides, as will be discussed below, an appropriate optical beam O directed at the exposed area 70.

Although FIG. 8 shows the heterostructure 2 as consisting of only one first potential well 3 and one second potential well 5, in practice there may be many first and second potential wells 3 and 5 separated by barrier layers similar to the barrier layer 4 so as to increase the current carrying capability of the conduction channel region 2. Also the or each second potential well 5 could be provided, separated by barrier layers, between two first potential wells 3 so that electrons can transfer to the second potential well from both first potential wells 3. The heterostructure 20 shown in FIG. 4 could be used to form the conduction channel region of a HEMT similar to that shown in FIG. 8.

It will of course be appreciated by those skilled in the art that the effective mass of a hole is much greater than that of an electron and that accordingly the probability of tunnelling of holes is much less than the probability of electrons tunnelling through the barrier layer 4.

In operation of the device shown in FIG. 8, when an appropriate voltage is applied between the source and drain regions 21 and 22 and the optical beam source 50 provides an optical beam O with an appropriate wavelength (of the order of 750 nm for the structure described above) equivalent to an energy hv equal to or greater than the electron-heavy hole (e-hh) exciton resonance of the first potential well 3 which is incident on the recess 70 (as shown perpendicularly of the layers of the conduction channel region 2), electron-hole pairs are generated in the first potential well 3.

As discussed above with reference to FIGS. 1 to 7 the photogenerated electrons transfer from the first potential well 3 to the second potential well 5 via the intermediate electron energy level $e_4$ provided by the barrier layer 4. The barrier layer 4 is sufficiently thick, 8 nm in the example described above, to inhibit tunnelling of the photogenerated holes produced in the first potential well 3 into the second potential well 5 and accordingly the photogenerated holes remain confined in the first potential well 3.

The transferred electrons are thus separated from their corresponding photogenerated holes and provide a conduction channel in the second potential well 5 whilst an applied voltage is maintained between the source and drain regions 20 and 21. The time for the HEMT to return to the non-conducting state when the optical beam O is switched off will depend on the time taken for recombination of these photogenerated electrons and holes which is in turn governed by the time taken for the holes to tunnel from the first potential well 3 to the second potential well 5.

Because the electrons transferred from the first potential well 3 to the second potential well 5 cannot readily recombine with holes, a high population of electrons can be built up in the second potential well 5 relatively easily and only a low power density, typically of the order of 1 Wcm$^{-2}$, is required for the incident optical beam to generate sufficient electrons to provide an electron current along the conduction channel provided by the second potential well 5.

Because the electrons are provided in the first potential well 3 by photogeneration of electron-hole pairs, there is no necessity for any intentional doping of either the potential wells 3 and 5 or the barrier layers 4,7 and 8 and accordingly the possibility of scattering of the conduction electrons being caused by dopant impurities is significantly reduced, so leading to significant improvements in electron mobility in the conduction channel provided by the second potential well 5.

The current handling capability of the high electron mobility device 10c will depend on the number of second potential wells 5. However, because in the materials system described above, the absorption coefficient perpendicular to the layers of the structure is quite small, a number of first and second potential wells can be provided so that the conduction channel is provided by a number of parallel second potential wells 5 which should increase the current handling capability.

As mentioned above, the time for recombination of the separated electrons and holes is governed by the time taken for the holes to tunnel from the first potential well 3 to the second potential well 5. This time is determined at least in part by the thickness of the barrier layer 4 and for the material system given above where the barrier layer is 8 nm thickness then the recombination time may be, typically, of the order of 0.5 to a few microseconds. Accordingly, the time for the HEMT to return to a non-conducting state when the optical beam O is switched off will be determined at least in part by this recombination time. The switching off time may be shortened by decreasing the barrier thickness towards the 2.5 nm minimum although this may require a higher power density from the optical beam O to enable switching on and conduction of the HEMT.

Again, the optically switched HEMT shown in FIG. 8 has applications as an optical switch, for example for use in image processing or optical computing.

The optical beam source 50 may be any one of the types of sources mentioned above and is selected to provide an optical beam O with at least a wavelength or range of wavelengths with an energy sufficient to provide the necessary electrons in the first potential well 3, that is with an energy equal to or greater than that of the e-hh exciton resonance of the first potential well 3.

Figure 9:
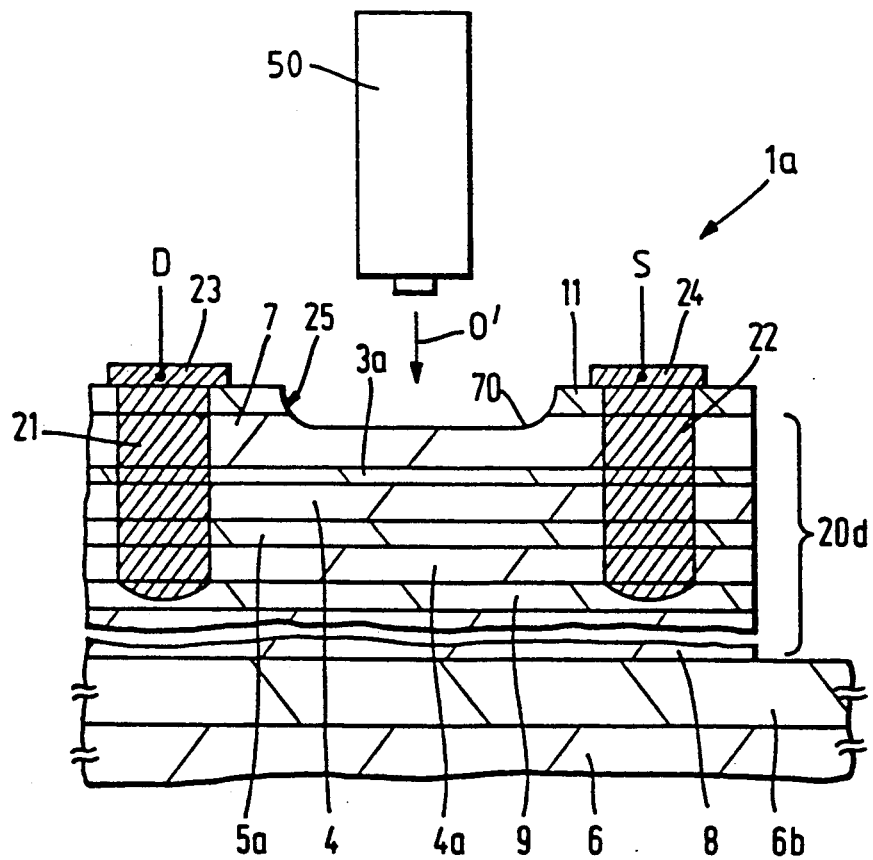
FIG. 9 illustrates schematically and in part broken-away cross-section a second embodiment of an optically switchable device comprising a high mobility semiconductor device in accordance with the invention in combination with an optical beam source.

FIG. 9 shows schematically and in part broken away cross-section a second embodiment of an optically activated HEMT 10d in accordance with the invention.

As can be seen most clearly from FIG. 3, the heterostructure 20d of the HEMT 10d provides a further potential well 9 separated from the second potential well 5a by a further barrier layer 4a and, as a comparison of FIG. 9 with FIGS. 6 and 7 will show, the heterostructure 20d corresponds to the heterostructure 20 in the same way as the heterostructure 20c corresponds to the heterostructure 2. That is, in particular, the heterostructure 20d is the same as the heterostructure 20 but inverted with respect to the substrate. Accordingly, the energy band diagram shown in FIG. 6 applies to the heterostructure 20d as well as the heterostructure 20.

In other respects, the HEMT 10d shown in FIG. 9 is similar to that shown in FIG. 8.

In such a structure electrons photogenerated by an appropriate optical beam O' in the first potential well 3a rapidly transfer via the intermediate electron energy level $e_4$ of the barrier layer 4, the electron energy level $e_{5a}$ of the second potential well 3a and the intermediate electron energy level $e_{4a}$ of the further barrier layer 4a to the third potential well 9 whilst the corresponding holes remain confined to the first potential well 3a. In this case the separation of the electrons and holes is further increased and may further reduce the possibility of scattering which could otherwise detrimentally affect the mobility of the conduction electrons.

The modified HEMT shown in FIG. 9 operates in a manner similar to that described above with reference to FIG. 8. Of course, the time required for the holes to tunnel to the third potential well 9 and thus the switching time of the HEMT will be increased. As in the case of FIG. 1, a plurality of potential wells 3a, 5a and 9 may be provided with, for example, the structure being symmetrical about a third potential well 9.

Although the devices have been described above as being formed with AlAs barrier layers and GaAs potential wells, other III-V semiconductor materials could be used provided that the material used for the barrier layer(s) can provide the necessary electron energy level(s).

Although in the arrangements described above the differing electron energy levels of the first and second potential wells 3 and 5 (and the third or potential well 9 if provided) are achieved by adjusting the thickness of the layers, it may be possible to achieve this effect by using a combination of different materials in place of or in addition to varying the layer thickness, for example, by using InGaAs for the second potential well.

Other semiconductor materials may be used, for example II-VI semiconductor materials may be used or a combination of different types of semiconductor materials, provided that the material used for the first well is a direct gap material.

Also, the present invention may be applied to other semiconductor devices having controllable conduction channel regions.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An optically switchable device comprising a heterostructure defining a first potential well separated by a barrier layer from a second potential well which provides an electron energy level which is lower in electron energy than the lowest electron energy level of the first potential well, characterised in that the barrier layer is formed so as to provide an intermediate electron energy level which is lower in electron energy than the lowest electron energy level of the first potential well but higher in electron energy than the lowest electron energy level of the second potential well and the barrier layer is sufficiently thick to inhibit tunnelling of holes from the first to the second potential well for confining holes of electron-hole pairs generated in the first potential well by an incident optical beam to the first potential well whilst facilitating transfer of the electrons of the electron-hole pairs from the first potential well to the second potential well via the intermediate electron energy level provided by the barrier layer.

2. A device according to claim 1, further characterised in that the first potential well is relatively narrow whilst the second potential well is relatively wide and so provides an electron energy level which is lower in electron energy than the lowest electron energy level of the first potential well.

3. A device according to claim 2, further characterised in that the first and second potential wells are formed by layers of the same semiconductor material.

4. A device according to claim 3, further characterised in that the first and second potential wells comprise layers of gallium arsenide and the barrier layer comprises a layer of aluminium arsenide.

5. A device according to claim 4, further characterised in that the first potential well is less than 3.5 nm (nanometers) wide, the second potential well is greater than 3.5 nm wide and the barrier layer is greater than 2.5 nm wide.

6. A device according to claim 5, further characterised in that the first potential well is 2.5 nm wide and the second potential well is 5 nm wide and the barrier layer is 8 nm wide.

7. A device according to claim 1, further characterised in that the first and second potential wells are formed by layers of different semiconductor material bounded by barrier layers so as to facilitate the provision within the second potential well of an electron energy level lower in electron energy than the lowest electron energy level of the first potential well.

8. A device according to claim 1, further characterised in that the heterostructure defines a plurality of first and second potential wells.

9. A device according to claim 1, further characterised in that, in respect of the or each second potential well, the heterostructure comprises a third potential well separated by a further barrier layer from the second potential well, the third potential well providing an electron energy level which is lower in electron energy than the lowest electron energy level of the second potential well and the further barrier layer being formed so as to provide an intermediate electron energy level which is lower in electron energy than the lowest electron energy level of the second potential well but higher in electron energy than the lowest electron energy level of the third potential well for facilitating transfer of the electrons from the second potential well to the third potential well via the intermediate electron energy level provided by the further barrier layer which is sufficiently thick to inhibit tunnelling of holes from the second to the third potential well.

10. An optical switching apparatus comprising a device in accordance claim 1, means for directing at the heterostructure an optical beam with a wavelength for generating electron hole pairs in the first potential well and means for controlling the power density of the optical beam provided by the directing means for switching the optical beam between a first relatively low power density insufficient to cause exciton bleaching and a second relatively high power density for causing sufficient electron-hole pairs to be generated such that electrons transfer from the first potential well to the second potential well to cause bleaching of at least one exciton resonance of the heterostructure to allow transmission through the heterostructure of an optical beam with an energy equivalent to or greater than that of the exciton resonance.

11. An optical switching apparatus according to claim 10, further characterised in that means are provided for directing a further optical beam with an energy equivalent to or greater than that of the exciton resonance of the heterostructure.

* * * * *